United States Patent
Eilert et al.

(10) Patent No.: US 12,299,291 B2
(45) Date of Patent: May 13, 2025

(54) PROGRAMMABLE METADATA

(71) Applicant: Micron Technology, Inc., Boise, ID (US)

(72) Inventors: Sean S. Eilert, Penryn, CA (US); Justin Eno, El Dorado Hills, CA (US); Ameen D. Akel, Rancho Cordova, CA (US)

(73) Assignee: Micron Technology, Inc., Boise, ID (US)

( * ) Notice: Subject to any disclaimer, the term of this patent is extended or adjusted under 35 U.S.C. 154(b) by 617 days.

(21) Appl. No.: 17/369,869

(22) Filed: Jul. 7, 2021

(65) Prior Publication Data

US 2023/0009642 A1    Jan. 12, 2023

(51) Int. Cl.
  *H03M 13/11* (2006.01)
  *G06F 3/06* (2006.01)
  *H03M 13/09* (2006.01)

(52) U.S. Cl.
  CPC .......... *G06F 3/0619* (2013.01); *G06F 3/0659* (2013.01); *G06F 3/0679* (2013.01); *H03M 13/098* (2013.01); *H03M 13/1105* (2013.01)

(58) Field of Classification Search
  CPC .... G06F 3/0619; G06F 3/0659; G06F 3/0679; G06F 3/0688; G06F 3/0607; G06F 12/0822; G06F 3/0604; G06F 3/0638; G06F 11/1068; H03M 13/098; H03M 13/1105; H03M 13/05; H03M 13/09; G11C 29/42
  USPC ........................................................ 714/764
  See application file for complete search history.

(56) References Cited

U.S. PATENT DOCUMENTS

| | | | |
|---|---|---|---|
| 9,311,226 B2* | 4/2016 | Mylly | G06F 3/0679 |
| 11,237,813 B1* | 2/2022 | Chen | G06F 8/61 |
| 2003/0146915 A1* | 8/2003 | Brook | G11B 27/11 |
| | | | 345/473 |
| 2013/0254627 A1* | 9/2013 | Jeddeloh | G06F 11/108 |
| | | | 714/764 |
| 2017/0033995 A1* | 2/2017 | Banka | H04L 41/40 |
| 2018/0027174 A1* | 1/2018 | Sengoku | H04N 23/73 |
| | | | 348/207.11 |
| 2019/0013081 A1* | 1/2019 | Blodgett | H04L 9/0861 |
| 2019/0369899 A1* | 12/2019 | Tanpairoj | G06F 1/324 |
| 2020/0151032 A1* | 5/2020 | Zhang | G06F 9/4881 |
| 2021/0064467 A1* | 3/2021 | Buerkle | G06F 11/1076 |
| 2021/0081273 A1* | 3/2021 | Helmick | G06F 9/30189 |
| 2021/0089217 A1* | 3/2021 | Bjørling | G06F 3/064 |
| 2021/0109654 A1* | 4/2021 | Agarwal | G06F 3/0611 |
| 2022/0012329 A1* | 1/2022 | Boling | G06F 21/577 |

* cited by examiner

*Primary Examiner* — Albert Decady
*Assistant Examiner* — Osman M Alshack
(74) *Attorney, Agent, or Firm* — Holland & Hart LLP

(57) ABSTRACT

Methods, systems, and devices for programmable metadata and related operations are described. A method may include receiving signaling that indicates a set of rules for transitions of states of metadata at a memory device storing the metadata. The memory device may receive a command from a host device associated with a set of data after receiving the set of rules. The memory device may transition metadata associated with the set of data stored at the memory device from a first state to a second state based in part on the set of rules and the command. The memory device may execute the command received from the host device.

20 Claims, 8 Drawing Sheets

| Opcode | Current State | New State |
|---|---|---|
| First Opcode | First State | No Change |
| | Second State | No Change |
| | Third State | First State |
| Second Opcode | . . . | . . . |
| . . . | . . . | . . . |

FIG. 3

PROGRAMMABLE METADATA

FIELD OF TECHNOLOGY

The following relates generally to one or more systems for memory and more specifically to programmable metadata.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), 3-dimensional cross-point memory (3D cross point), not-or (NOR), and not-and (NAND) memory devices, self-selecting memory, chalcogenide memory technologies, and others. Memory cells may be volatile or non-volatile. Non-volatile memory (e.g., FeRAM or NAND memory cells) may maintain their stored logic state for extended periods of time even in the absence of an external power source. Volatile memory devices, e.g., DRAM, may lose their stored state when disconnected from an external power source.

BRIEF DESCRIPTION OF THE DRAWINGS

FIG. 3 illustrates an example of a table that supports programmable metadata in accordance with examples as disclosed herein.

DETAILED DESCRIPTION

Figure 1:
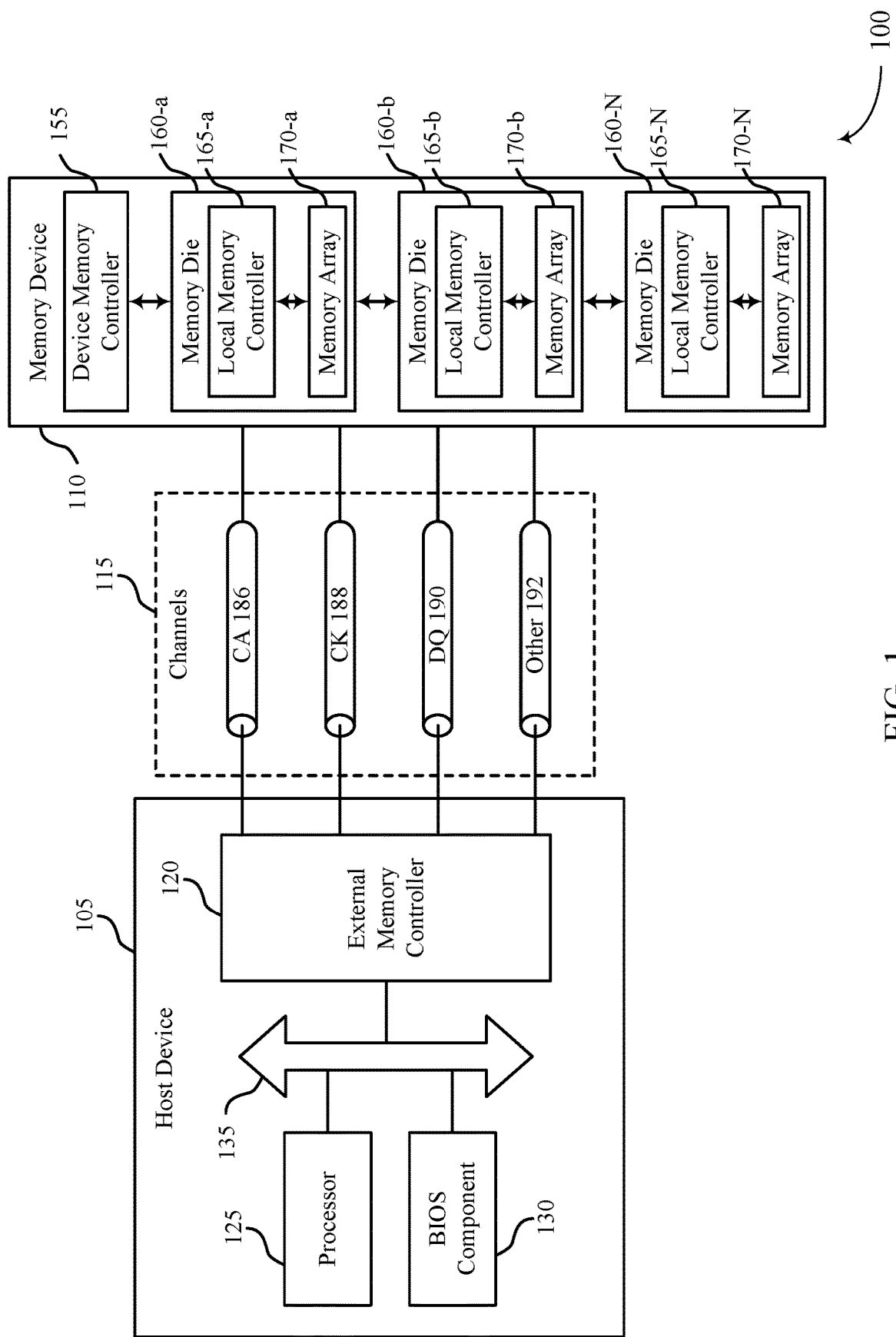
FIG. 1 illustrates an example of a system that supports programmable metadata in accordance with examples as disclosed herein.

A system may include a host device and a memory device that stores data for the host device. Some memory devices may store metadata that augment the data stored by the memory device. For example, metadata may include user permissions, information about when the data was last modified, information about when the data was created, and additional information about the data stored. In some examples, the metadata may be utilized for cache coherency. For example, the metadata may indicate a state for the cache coherency in the system—e.g., the metadata may indicate if a different device in the system also has a copy of the same data. In some examples, the host device may access the metadata directly, with or without accessing the data. For example, the host device may modify the metadata without modifying the data stored at the memory device. Whether the host modifies the data or not, the host device may communicate commands to the memory device over a bus coupling the memory device and the host device to modify the metadata. By communicating commands to modify the metadata stored at the memory device, the latency, power consumption, and bandwidth usage of the system may increase, and the overall performance may decrease. In other examples, a memory system may modify the metadata automatically according to a fixed set of rules. However, modification of the metadata only according to a fixed set of rules may limit the flexibility of managing the metadata— e.g., the memory controller may be unable to perform application-specific updates.

Systems, techniques, and devices are described herein for a memory device to modify metadata directly in a programmable manner. For example, a system may include programmability of metadata state transitions such that the memory device may perform automatic flexible state transitions. The memory device may make the metadata state transitions based on a variety of command sequences received. In some examples, the metadata state transition rules may be programmed to the memory device using a table or other transition definitions (e.g., a function). By enabling the memory device to modify the metadata directly, the latency, power consumption, and bandwidth usage of the system may be improved, and the overall performance of the system may increase. Additionally, in examples where the memory device performs on-chip error correction code (ECC), the memory device modifying the metadata may also modify the parity bits accordingly. This enables the memory device to update the metadata without having the metadata directly accessed by the host device.

In some examples, the modification of the metadata may also be performed automatically at a memory system level. For example, a memory system may manage commands sent to memory devices based on which memory devices store metadata. For example, the memory system may identify a first memory device that stores metadata for the system and send a command to modify the metadata. The memory device may include the capability of modifying the metadata directly, reducing the latency of the system as the quantity of communications between the memory system and the memory device may be reduced. The memory system may also decode stored codewords, perform metadata state transitions, reencode the codeword, and write the codeword across multiple memory devices. The metadata state transitions may be programmable and may provide the system flexibility to modify the metadata transition rules. For example, the memory system may receive a new set of metadata state transitions and modify the metadata according to the new set of metadata state transitions. Also, the memory system may perform application specific updates. By utilizing a programmable set of rules, the memory system may adapt flexibly to changing applications or usage of the metadata for automatic metadata state transitions.

Features of the disclosure are initially described in the context of systems and dies as described with reference to FIG. 1. Features of the disclosure are described in the context of process flows, systems, and tables as described with reference to FIGS. 2-4 These and other features of the disclosure are further illustrated by and described with reference to an apparatus diagram and flowcharts that relate to programmable metadata as described with reference to FIGS. 5-8.

FIG. 1 illustrates an example of a system 100 that supports programmable metadata in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

The host device 105 may include one or more devices, and in some cases may include a processor chipset and a software stack executed by the processor chipset. For example, the host device 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., PCIe controller, SATA controller). The host device 105 may use the memory device 110, for example, to write data to the memory device 110 and read data from the memory device 110. Although one memory device 110 is shown in FIG. 1, the host device 105 may be coupled with any quantity of memory devices 110.

The host device 105 may be coupled with the memory device 110 via at least one physical host interface. The host device 105 and the memory device 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a serial advanced technology attachment (SATA) interface, a UFS interface, an eMMC interface, a peripheral component interconnect express (PCIe) interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host device controller of the host device 105 and a memory device controller 155 of the memory device 110. In some examples, the host device 105 may be coupled with the memory device 110 (e.g., the host system controller may be coupled with the memory system controller 155) via a respective physical host interface for each memory device 110 included in a memory system coupled with the host device 105, or via a respective physical host interface for each type of memory device 110 included in the memory system.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The memory device 110 may be or include any device or collection of devices, where the device or collection of devices includes at least one memory array. For example, a memory device 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities. The memory device 110 may include one or more memory die 160 of any type of memory cells (e.g., non-volatile memory cells, volatile memory cells, or any combination thereof). For example, the memory device 110 may include NAND (e.g., NAND flash) memory, ROM, phase change memory (PCM), self-selecting memory, other chalcogenide-based memories, ferroelectric RAM (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), and electrically erasable programmable ROM (EEPROM). Additionally or alternatively, a memory device 110 may include one or more arrays of volatile memory cells. For example, a memory device 110 may include random access memory (RAM) memory cells, such as dynamic RAM (DRAM) memory cells and synchronous DRAM (SDRAM) memory cells The host device 105 may include one or more of an external memory controller 120, a processor 125, a basic input/output system (BIOS) component 130, or other components such as one or more peripheral components or one or more input/output controllers. The components of host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths to decode one or more of address or command data (e.g., eight or nine signal paths).

In some examples, clock signal channels 188 may be operable to communicate one or more clock signals between the host device 105 and the memory device 110. Each clock signal may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal therefore may be referred to as a control clock signal, a command clock signal, or a system clock signal. A system clock signal may be generated by a system clock, which may include one or more hardware components (e.g., oscillators, crystals, logic gates, transistors).

In some examples, data channels 190 may be operable to communicate one or more of data or control information between the host device 105 and the memory device 110. For example, the data channels 190 may communicate information (e.g., bi-directional) to be written to the memory device 110 or information read from the memory device 110.

The channels 115 may include any quantity of signal paths (including a single signal path). In some examples, a channel 115 may include multiple individual signal paths. For example, a channel may be x4 (e.g., including four signal paths), x8 (e.g., including eight signal paths), x16 (including sixteen signal paths), etc.

In some examples, the one or more other channels 192 may include one or more error detection code (EDC) channels. The EDC channels may be operable to communicate error detection signals, such as checksums, to improve system reliability. An EDC channel may include any quantity of signal paths.

In some examples, the memory device 110 may also store metadata that augments the data stored in the memory device 110. For example, metadata may include user permissions, information about when the data was last modified, information about when the data was created, and additional information about the data stored. In some examples, the metadata may be utilized for cache coherency. For example, the metadata may indicate a state for the cache coherency in the system—e.g., the metadata may indicate if a different memory device 110 coupled to the host device 105 in the system 100 also has a copy of the same data. In some examples, the host device 105 may update the metadata directly. In such examples, there may be an increase in latency and a decrease in overall system 100 performance. In other examples, the memory device 110 may be configured to do implicit (e.g., automatic) metadata updates based on a fixed set of rules. In such examples, the memory device 110 may be unable to perform metadata updates for application specific "business logic." That is, the memory device 110 may have the fixed set of rules hard-wired into the memory die 160. For example, the memory die 160 may support a first command to write a set of data and second command to write a set of data and update metadata based on a fixed set of rules associated with the second command.

As described herein, the memory device 110 may be configured to perform implicit metadata updates based on a programmable set of rules received from the host device 105. For example, the memory device 110 may receive a set of rules for metadata state transitions such that the memory device 110 may perform automatic flexible state transitions. As the rules are programmable, the memory device 110 need not be hard-wired with the set of rules or associations between particular commands and rules for metadata updating. The memory device 110 may also reduce bandwidth and power consumption when automatically transitioning the metadata states rather than having the host device 105 perform the updates directly.

Additionally, when multiple memory die 160 are coupled with the memory device controller 155, the memory device controller 155 (e.g., memory system controller) may be configured to perform implicit metadata updates based on a programmable set of rules received from the host device 105 for the system as a whole. For example, the memory device controller 155 may identify that a memory die 160-a stores the metadata associated with the command received and the remaining memory die 160 store the data associated with the command. In such examples, the memory device controller 155 may send a first command to the memory die 160-a to update the metadata (e.g., as a stand-alone command, or as part of an access operation such as a read, write, or refresh operation) and a second command to the remaining memory die 160 to perform an operation received from the host device 105. Alternatively, the memory device controller 155 may decode a codeword stored across multiple memory die 160, update the metadata, and then write a second codeword back to the multiple memory die 160.

Figure 2A:
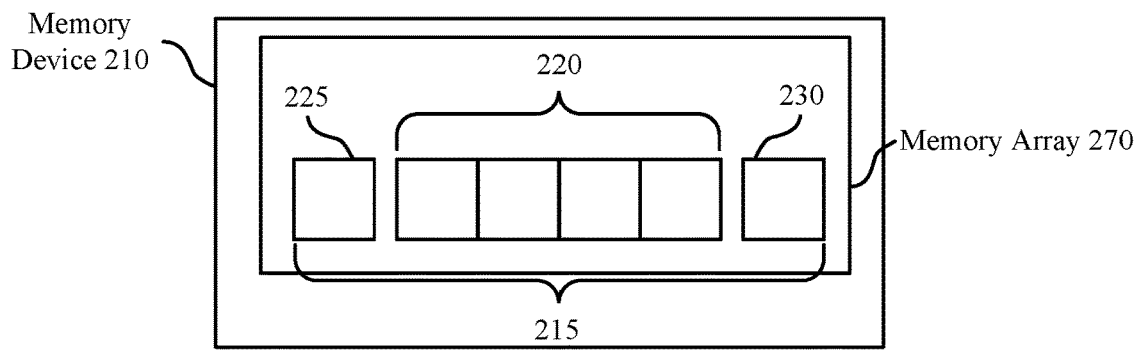
FIGS. 2A and 2B illustrate examples of a device and process flow that support programmable metadata in accordance with examples as disclosed herein.

FIG. 2A illustrates an example of a system 200 that supports programmable metadata in accordance with examples as disclosed herein. The system 200 may include a memory device 210 and memory array 270 which may be examples of memory device 110 and memory array 170 as described with reference to FIG. 1. The memory array 270 may store a codeword 215. In some examples, the codeword 215 may include metadata 225, data 220, and parity bits 230. Although the metadata 225 is shown as part of the codeword 215, in other examples the metadata 225 may be separate from the codeword 215.

Memory device 210 may be configured to store data 220 for a host device (e.g., host device 105 as described with reference to FIG. 1). The memory device may be an example of a DRAM device, a UFS device, part of a compute express link (CXL) system, or a different type of memory that communicates with a host interface—e.g., other non-volatile or volatile memories. In some examples, the memory device may store the data 220 as part of a codeword 215. For example, the codeword 215 may also include metadata 225 configured to augment the data 220. The metadata 225 may include user permissions, information about when the data was last modified, information about when the data was created, and additional information about the data 220 stored. In some examples, the metadata 225 may be configured to indicate a cache coherency. In other examples, the metadata 225 may be configured to track updates received by the memory device 210—e.g., the metadata 225 may be utilized in transactional memory. The metadata 225 may also be utilized to swap half pages of data 220 received by the memory device 210—e.g., the metadata 225 may indicate a location to store the half pages of data 220 to increase access speeds. The codeword 215 may also include parity bits 230. In some examples, the parity bits 230 may also be considered a part of the metadata 225. In other examples, the parity bits 230 may be independent from the metadata 225. The parity bity 230 may be configured to provide protection (e.g., using an error correction code (ECC)) for the data 220 stored at the memory device 210.

In some examples, the memory device 210 may be included in a memory system. In such examples, the memory device 210 may be one memory device 210 of a plurality of memory devices 210 in the memory system. Additionally, the memory device 210 may be considered a memory die when included in the memory system. In some examples, the memory device 210 may store the metadata 225 for the entire memory system—e.g., the memory system may designate memory device 210 to store metadata 225 for the entire memory system. In other examples, the memory system may write the codeword 215 across the plurality of memory devices 210. For example, the memory system may encode the codeword 215 and then write a first portion to memory device 210 and a second portion to a different memory device of the plurality of memory devices 210.

Figure 2B:
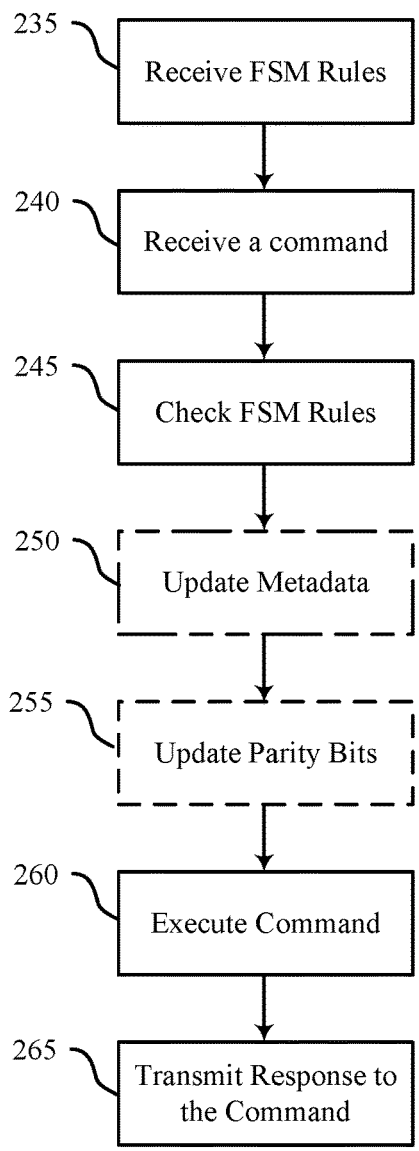

FIG. 2B illustrates an example of a process flow 201 that supports programmable metadata in accordance with examples as disclosed herein. Although shown in a particular sequence or order, unless otherwise specified, the order of the processes may be modified. Thus, the illustrated examples are used as examples, and the illustrated processes may be performed in a different order, and some processes may be performed in parallel. Additionally, one or more processes may be omitted in various examples. Thus, not all processes are used in every example. Other process flows are possible. In some examples, the memory device 210 may perform the process flow 201. The process flow 201 may illustrate a memory device 210 or memory die 210 performing explicit or automatic metadata transitions.

At 235, the memory device 210 (or memory system) may receive finite state machine (FSM) rules for metadata 225 updates. For example, the memory device 210 may receive signaling that indicates a set of rules for transitions of states of metadata 225. In some examples, the metadata 225 may indicate a state of cache coherency in the memory device 210 and the set of rules may indicate the transitions of those states. In some examples, the memory device 210 may receive the rules as a table—e.g., data or a bit string representative of a table. In other examples, the memory device 210 may receive the set of rules as a function. In some cases, the memory device 210 may be programmed with the set of rules by a host system (e.g., host device 105). In other cases, the memory device 210 may be configured with the set of rules by a register-transfer level (RTL) description. In some cases, the memory device 210 may include a mode register for selecting the set of rules. In such examples, the memory device 210 may store a plurality of rule sets including predetermined rules the memory device 210 may implement. The memory device 210 mode register may be used to select an active set of rules. That is, the host device may indicate a set of rules from the plurality of rule sets stored at the memory device 210 by storing a value associated with the set of rules in the mode register. The memory device 210 may then utilize the set of rules indicated by the mode register. In some examples, the set of rules may indicate whether to transition a state of the metadata 225 based on a command received and a current state of the metadata 225.

At 240, the memory device 210 (or memory system) may receive a command. In some examples, the memory device 210 may receive the command from the host device. For example, the memory device may receive an access command (e.g., a read, write, or refresh command) from the host device.

At 245, the memory device 210 (or memory system) may check the set of rules (e.g. the FSM rules). For example, the memory device 210 may compare the command received to a command indicated in the set of rules. The memory device 210 may also decode the codeword 215 associated with the command to extract the metadata 225—e.g., the memory device 210 may perform an internal read and decode the codeword associated with the command. The memory device 210 may then compare the current state of the metadata 225 to the set of rules to determine if the metadata 225 should be automatically updated based on the current state and the command received by the memory device 210. For example, the set of rules may indicate how to transition a state of the metadata 225 based on receiving a read command—e.g., the set of rules may indicate that if a read command is received and the metadata 225 has a first state value A, then the metadata 225 should be updated to a second state value B. Accordingly, the memory device 210 may compare the command received to the associated command entry in the set of rules and the current metadata 225 state to identify the state transition (if any) indicated by the rules.

In some examples, the command received may include an explicit metadata update. That is, the host device may indicate the metadata 225 should be updated at the memory device 210. In such examples, the memory device 210 may bypass checking the FSM rules and proceed to block 250 to update the metadata according to the explicit metadata instructions received.

At 250, the memory device 210 (or memory system) may update the metadata 225. In some examples, based on the comparison at block 245, the memory device 210 may determine if the metadata 225 should be updated. For example, if the memory device determines the command received is a read command and the extracted metadata 225 has the first state value A, then the memory device 210 may update the metadata 225 to the second state value B. If the set of rules instead indicates that a read command and a current metadata 225 having a first state value A should remain in that state, the memory device 210 may refrain from modifying the metadata 225.

At 255, the memory device 210 (or memory system) may also modify parity bits 230. In some examples, the memory device 210 may perform ECC operations—e.g., on-die ECC. In such examples, when the metadata 225 is modified, the parity bits 230 may also be modified. That is, if the memory device 210 utilizes the parity bits 230 to provide ECC protection to the codeword 215, then updating the metadata 225 and the codeword 215 will cause the parity bits 230 to be invalid. Accordingly, the memory device 210 may also update the parity bits 230 to reflect the modifications made to the metadata 225 and the codeword 215.

At 260, the memory device 210 (or memory system) may execute the command. For example, the memory device may perform a read operation, a write operation, or a refresh operation—e.g., the memory device 210 may read data 220 to the host device during a read command or the memory device 210 may write data 220 to the memory array 270 during a write operation. Additionally, during the execution of the operation, the memory device 210 may encode the codeword 215—e.g., the memory device 210 may encode the codeword 215 based on the change in parity bits 230 and the state change of the metadata 225.

At 265, the memory device 210 (or memory system) may transmit a response to the host device. For example, in response to a read command, the memory device 210 may output data 220 to the host device while transmitting the response. In some examples, the memory device 210 may also include the metadata 225 in the response. The state of the metadata 225 transmitted to the host device may also be programmable. That is, in some cases, the memory device 210 may be programmed to transmit the metadata 225 in the state it was before any modification (e.g., the metadata 225 at the time the command was received). In other examples, the memory device 210 may be programmed to transmit the modified metadata 225—e.g., the metadata 225 as modified automatically by the set of rules. In examples where the memory device 210 performs a write operation, the response transmitted to the host device may indicate the write operation is complete. The response may also include the metadata 225 as programmed by the host device FIG. 3 illustrates an example of a table 300 that supports programmable metadata in accordance with examples as disclosed herein. In some examples, table 300 may be an example of a table a memory device (e.g., memory device 210 as described with FIG. 2A) receives as part of metadata state transition rules as described with reference to FIG. 2. Table 300 may include a column specifying an opcode 305, a second column specifying a current state 310, and a third column specifying a new state 315.

In some examples, a memory device (or memory system) may perform an automatic modification of metadata (e.g., metadata 225 as described with reference to FIG. 2). For example, the memory device may modify the metadata to keep track of updates received at the memory device—e.g., transactional memory. The memory device may also update the metadata and utilize the updates to determine a most efficient location to store incoming data—e.g., the memory device may swap half pages of data to make future access of the data more efficient. As described herein in FIG. 3, the memory device may perform transitions of a state of the metadata as described with reference to FIG. 2—e.g., utilize the metadata to keep track of cache coherency.

To perform the automatic metadata modifications, the memory device may receive a set of rules (e.g., FSM rules) from the host device. The set or rules may be a function or may be programmed to the memory device from a host device as described with reference to FIGS. 2A and 2B. As described herein, the set of rules may be received as data or a bit string representative of the table 300. In some examples, the table 300 may be programmed to the memory device upon a power-up—e.g., if the memory device includes volatile memory, a host device (e.g., host device 105 as described with reference to FIG. 1) may program a table 300 each time the memory device powers up. In other examples, the table 300 may optionally be programmed to the memory device upon an initial configuration—e.g., if the memory device includes non-volatile memory, the host device may program the table 300 during an initial power-up and refrain from reprogramming the table 300 on each subsequent power-up. In such examples, if the host device does reprogram the table 300, the host device may also issue a "Reset Metadata" command. That is, the host device may reset the metadata types (e.g., the cache coherency states) when reprogramming the table 300. In either example (e.g., volatile and non-volatile memory), the host device may reprogram the table 300 during any period—e.g., the host device may reprogram the table 300 before sending a command to the memory device to ensure the memory device properly updates the metadata.

Table 300 may indicate to the memory device when to modify or refrain from modifying the state of the metadata. For example, the first column of the table 300 may include an opcode 305. The opcode 305 may be an example of a code associated with a command the memory device receives—e.g., "ReadData" may be an opcode for a read command received by the memory device. The table 300 may store an entry for each opcode the memory device may receive. That is, the first column may store a plurality of opcodes the memory device may receive, and the memory device may compare an incoming opcode to the opcodes stored in the first column to determine which rule to utilize when modifying the metadata. For example, the first opcode 320 may be an example of a "ReadData". Accordingly, when the memory device receives a read command, the memory device may identify the first opcode 320 entry in the table 300.

Table 300 may also indicate to the memory device how to modify the state of the metadata based on the current state 310 of the metadata. For example, the memory device may identify the first opcode 320 entry and determine that the current state 310 of the metadata is a first state. Based on the table 300, the memory device may refrain from modifying the metadata state. In other examples, if the memory device identifies the first opcode 320, and that the current state 310 is a third state, the memory device may transition the metadata from the third state to the first state. That is, the memory device may be configured to transition or modify the metadata based in part on the incoming command and the current state 310 of the metadata.

In some examples, the first state, a second state, and the third state may represent states of cache coherency. For example, the first state may be associated with an "any" state—e.g., the data associated with the metadata may exist in a cache of another memory device (e.g., socket) and thus may be out of synch. The second state may be associated with an "invalid" state—e.g., the data associated with the metadata is clean and does not exist in the cache of any other memory device. The third state may be associated with a "shared" state—e.g., the data associated with the metadata is clean and may be stored in a cache of another memory device, but additional communication may be necessary. It should be noted that three states are shown for illustrative purposes only. An entry for the first opcode 320 may include more than three states or less than three states—e.g., the first opcode 320 entry may include one, two, three, four, five, six, seven, eight, nine, ten, eleven, twelve, thirteen, fourteen, fifteen, sixteen, seventeen or more states. The second opcode entry 325 may also include the same quantity of states as the first opcode 320 entry. The table 300 may have additional opcode entries 330. In some cases, the opcode entries may have explicitly indicated states where the new state 315 is different from the current state 310. That is, an absence of an explicit state entry in an opcode entry may be an implicit indication for no change between the current state 310 and new state 315.

Figure 4A:
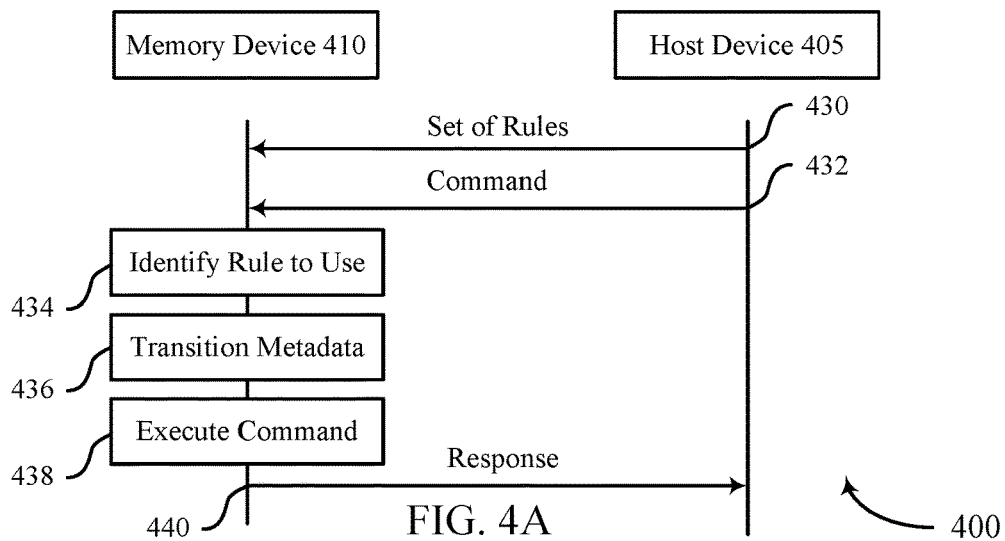
FIGS. 4A, 4B, and 4C illustrate examples of process flows that support programmable metadata in accordance with examples as disclosed herein.
Figure 4B:
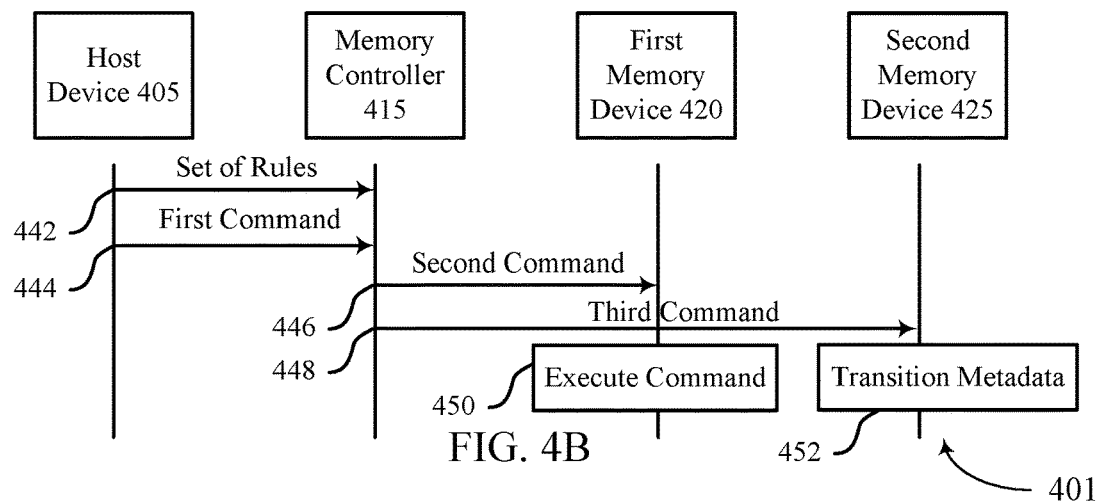
Figure 4C:
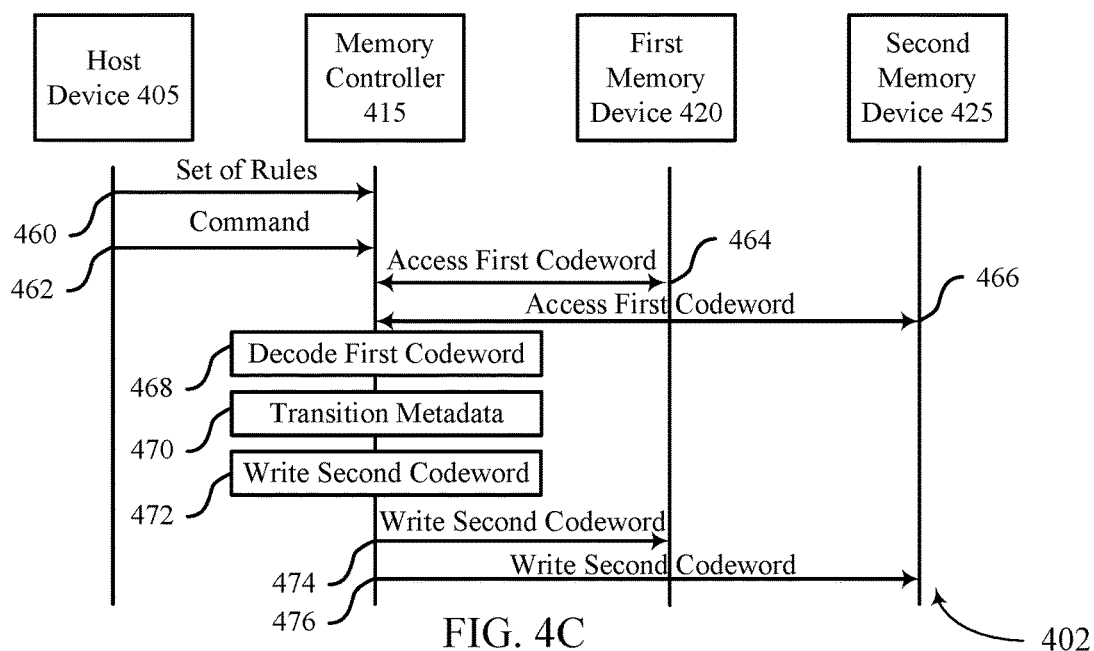

FIGS. 4A, 4B, and 4C illustrate examples of process flows 400, 401, and 402 that support programmable metadata in accordance with examples as disclosed herein. Process flow 400 may be performed by a host device 405 and a memory device 410, which may be respective examples of a host device 105 and a memory device 110 as described with reference to FIG. 1. Although shown in a particular sequence or order, unless otherwise specified, the order of the processes may be modified. Thus, the illustrated examples are used as examples, and the illustrated processes may be performed in a different order, and some processes may be performed in parallel. Additionally, one or more processes may be omitted in various examples. Thus, not all processes are used in every example. Other process flows are possible. The process flow 400 illustrates examples for automated metadata updates in a system including a memory device and a host device.

At 430, the memory device 410 may receive a set of rules from the host device 405. As described with reference to FIGS. 2B and 3, the set of rules may be utilized for a transition of a state of metadata (e.g., metadata 225 as described with reference to FIG. 2). The memory device 410 may receive the set of rules as a table (e.g., table 300 as described with reference to FIG. 3) or function. In some examples, the host device 405 may program the set of rules to the memory device 410 via an RTL, a mode register, or other description of the set of rules as described with reference to FIG. 2B. The set of rules may be programmable—e.g., the host device 405 may transmit any set of rules in accordance with the operations and tasks of the host device 405. The host device 405 may also transmit a second set of rules to the memory device 410 at any period after the first set of rules are received by the memory device 410. For example, the host device 405 may update the set of rules and transmit a second set of rules to the memory device after a first command. In such examples, the memory device 410 may utilize the second set of rules to perform the automated modifications to the metadata.

At 432, the memory device may receive a command from the host device 405. For example, the host device 405 may issue an access command (e.g., read, write, or refresh command). In some examples, the host device 405 may also include an explicit metadata update or state transition.

At 434, the memory device may identify a rule from the set of rules to utilize based on the received command. For example, as described with reference to FIG. 3, the memory device 410 may identify an entry in a table associated with the set of rules to determine how to transition a state of the metadata. In some examples, the memory device 410 may perform an internal read to identify a codeword (e.g., codeword 215 as described with reference to FIG. 2) associated with the command received. The memory device 410 may then extract the metadata by decoding the codeword. After extracting the metadata, the memory device 410 may identify a current state of the metadata. By identifying the rule and the current state, the memory device 410 may determine how to transition the state of the metadata. In examples where the host device 405 includes an explicit metadata modification, the memory device 410 may refrain from identifying a rule in the set of rules. That is, when the memory device 410 receives an explicit command to update the metadata, the memory device 410 may refrain from performing an implicit (e.g., automatic) metadata modification. Thus, the explicit metadata modification may be used to override an implicit metadata modification rule.

At 436, the memory device 410 may transition a state of the metadata. For example, after determining the rule associated with the command received and the current state of the metadata, the memory device 410 may determine a new state of the metadata. As described with reference to FIG. 3, the new state may be the same as or a different state than the current state. For example, the memory device 410 may determine that a read command is received and that the current state of the metadata is a third state. In such examples, the memory device 410 may transition the state of the metadata to a first state (e.g., the new state) based on the set of rules received.

At 438, the memory device 410 may execute the command. While executing the command, the memory device 410 may encode a second codeword. That is, the memory device 410 may write a second codeword that includes the updated metadata, parity bits (e.g., parity bits 230 as described with reference to FIG. 2A), and data associated with the command.

At 440, the memory device 410 may transmit a response to the host device 405. In some examples, the response may indicate a completion of an operation associated with the command (e.g., a write command). In other examples, the memory device 410 may transmit data requested by the host device 405 in the response (e.g., a response to a read command). In such examples, the memory device 410 may be programmed to either include the current metadata state (e.g., the metadata state at the time the command was received) or the new metadata state.

Process flow 401 may be performed by a host device 405 which may be an example of a host device 105 as described with reference to FIG. 1. The process flow 401 may also be performed by a memory controller 415 (e.g., a memory controller of a memory system) and a first memory device 420 and a second memory device 425, each coupled with the memory controller 415. A first memory device 420 and a second memory device 425, are shown for the sake of clarity only. That is, the memory controller 415 may be coupled with a plurality of memory devices, where the first memory device 420 and the second memory device 425 may be a part of the plurality of memory devices. In some examples, the first memory device 420 and the second memory device 425 may be referred to as first memory die 420 and second memory die 425—e.g., the memory controller 415 may be coupled with a plurality of memory die. Although shown in a particular sequence or order, unless otherwise specified, the order of the processes may be modified. Thus, the illustrated examples are used as examples, and the illustrated processes may be performed in a different order, and some processes may be performed in parallel. Additionally, one or more processes may be omitted in various examples. Thus, not all processes are used in every example. Other process flows are possible. The process flow 401 illustrates examples for automated metadata updates in a system including a host device and a memory system including a memory controller 415 and a first memory device 420 and a second memory device 425.

At 442, the memory controller 415 may receive a set of rules from the host device 405. As described with reference to FIGS. 2 and 3, the set of rules may be utilized for a transition of a state of metadata (e.g., metadata 225 as described with reference to FIG. 2). As described at 430, the set of rules may be programmable by the host device 405 and transmitted at any time.

At 444, the memory controller 415 may receive a first command from the host device 405. For example, the host device 405 may issue an access command (e.g., read, write, or refresh command). In some examples, the host device 405 may also include an explicit metadata update or state transition as part of or in association with the access command.

At 446, the memory controller 415 may transmit a second command to the first memory device 420. For example, the memory controller 415 may identify that a set of data associated with the command is located at the first memory device 420. Accordingly, the memory device 410 may transmit the second command indicating an operation to be performed on the set of data (e.g., the read, write, or refresh operation). In some examples, the set of data associated with the command may be stored at multiple memory devices. In such examples, the memory controller 415 may transmit the second command to each memory device storing a portion of the set of data.

At 448, the memory controller 415 may transmit a third command to the second memory device 425. For example, the memory controller 415 may identify that the second memory device 425 stores metadata associated with the set of data. In some examples, the memory controller 415 may designate the second memory device 425 to store all metadata associated with data stored across the plurality of memory devices coupled with the memory controller 415. The memory controller 415 may transmit the third command based on determining a rule for transitioning a state of the metadata stored at the second memory device. For example, the memory controller 415 may transmit a rule in the third command that indicates that the second memory device 425 should transition the metadata from a first state to a second state (e.g., from a current state to a new state). In such examples, the memory controller 415 may utilize the set of rules received from the host device 405 to determine which rule to select from the plurality of rules. In examples where the host device 405 transmits an explicit metadata update or state transition, the memory controller 415 may transmit that same explicit command to the second memory device 425 in the third command.

At 450, the first memory device 420 may execute the second command. For example, the first memory device 420 perform a read, write, or refresh operation, based on the first command received.

At 452, the second memory device 425 may transition a state of the metadata associated with the set of data based on the third command received. For example, the second memory device 425 may modify the metadata from the first state to the second state based on the indication of the third command. In some examples, the second memory device may also execute the third command to perform an operation. For example, the memory controller 415 may transmit instructions in the third command to perform an operation on a portion of data associated with the first command. That is, in some examples the data associated with the first command may be stored at the first memory device 420 (e.g., a first portion of the data) and the second memory device 425 (e.g., a second portion of the data). In such examples, the memory controller 415 may send the third command to include an operation to perform and the metadata transition rules. For example, if the memory controller 415 received a read command from the host device 405, the memory controller 415 may transmit a read command for the second portion of data along with the metadata update rule (e.g., a read command that is associated with a metadata update).

Process flow 402 may be performed by a host device 405 which may be an example of a host device 105 as described with reference to FIG. 1. The process flow 401 may also be performed by a memory controller 415 (e.g., a memory controller of a memory system) and a first memory device 420 and a second memory device 425, each coupled with the memory controller 415. A first memory device 420 and a second memory device 425, are shown for the sake of clarity only. That is, the memory controller 415 may be coupled with a plurality of memory devices, of which the first memory device 420 and the second memory device 425 may be a part. In some examples, the first memory device 420 and the second memory device 425 may be referred to as first memory die 420 and second memory die 425—e.g., the memory controller 415 may be coupled with a plurality of memory die. Although shown in a particular sequence or order, unless otherwise specified, the order of the processes may be modified. Thus, the illustrated examples are used as examples, and the illustrated processes may be performed in a different order, and some processes may be performed in parallel. Additionally, one or more processes may be omitted in various examples. Thus, not all processes are used in every example. Other process flows are possible. The process flow 401 illustrates examples for automated metadata updates in a system including a host device and a memory system including a memory controller 415 and a first memory device 420 and a second memory device 425.

At 460, the memory controller 415 may receive a set of rules from the host device 405. As described with reference to FIGS. 2B and 3, the set of rules may be utilized for a transition of a state of metadata (e.g., metadata 225 as described with reference to FIG. 2A). As described at 430, the set of rules may be programmable by the host device 405 and transmitted at any time.

At 462, the memory controller 415 may receive a command from the host device 405. For example, the host device 405 may issue an access command (e.g., read, write, or refresh command). In some examples, the host device 405 may also include an explicit metadata update or state transition.

At 464 and 466, the memory controller 415 may access a first codeword at the first memory device 420 and the second memory device 425. For example, the memory controller 415 may identify a first codeword associated with the command received from the host device 405. In some examples, the codeword may be stored across multiple memory devices coupled with the memory controller 415—e.g., a first portion of the codeword may be stored at the first memory device 420 and a second portion of the codeword may be stored at the second memory device 425. Accordingly, the memory controller 415 may access the first portion at the first memory device 420 and the second portion at the second memory device 425.

At 468, the memory controller 415 may decode the first codeword accessed from the first memory device 420 and the second memory device 425. While decoding the codeword, the memory controller 415 may also extract metadata associated from the first codeword. Then, the memory controller 415 may then determine an entry in a table (e.g., or a rule from the set of rules) associated with the command received from the host device 405 as described with reference to FIG. 3. The memory controller 415 may also identify a current state of the metadata extracted from the first codeword. The memory controller 415 may then determine if the metadata will have a state transition based on the command received and the current state. In examples where the host device includes an explicit metadata update in the command, the memory controller 415 may refrain from utilizing a rule and instead follow the instructions in the command received.

At 470, the memory controller 415 may transition a state of the metadata based on decoding the first codeword. For example, the memory controller 415 may have determined the set of rules indicate the metadata will transition from a first state to a second state based on the current metadata state, the command received, and the table entry or rule as described at 468. In some examples, when the host device 405 includes an explicit metadata update in the command, the memory controller may utilize the instructions received from the host device 405 to transition a state of the metadata.

At 472, the memory controller 415 may write a second codeword based on the transition of the state of metadata. For example, the memory controller 415 may write the second codeword to include the updated metadata state (e.g., the new state), updated parity bits, and a second set of data that results from the execution of the command. That is, the memory controller 415 may execute the command after transitioning the state of the metadata and the operation may result in a second set of data as modified by the operation.

At 474 and 476, the memory controller 415 may write the second codeword back to the first memory device 420 and the second memory device 425. That is, the second codeword may also have a first portion and a second portion. The memory controller 415 may write the first portion of the second codeword to the first memory device 420 and the second portion of the codeword to the second memory device 425.

Figure 5:
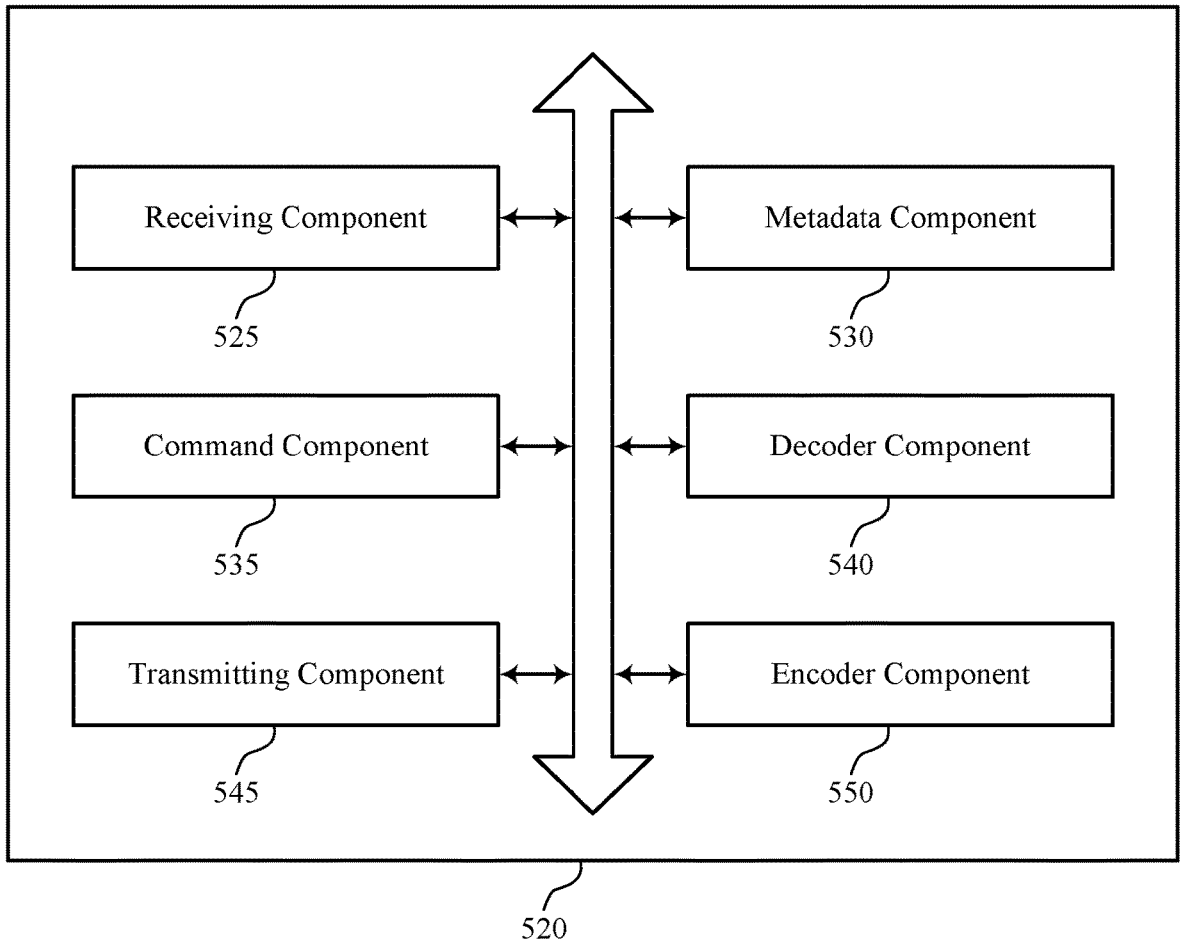
FIG. 5 shows a block diagram of a memory device that supports programmable metadata in accordance with examples as disclosed herein.

FIG. 5 shows a block diagram 500 of a memory device 520 that supports programmable metadata in accordance with examples as disclosed herein. The memory device 520 may be an example of aspects of a memory device as described with reference to FIGS. 1 through 4. The memory device 520, or various components thereof, may be an example of means for performing various aspects of programmable metadata as described herein. For example, the memory device 520 may include a receiving component 525, a metadata component 530, a command component 535, a decoder component 540, a transmitting component 545, an encoder component 550, or any combination thereof. Each of these components may communicate, directly or indirectly, with one another (e.g., via one or more buses).

The receiving component 525 may be configured as or otherwise support a means for receiving, at a memory device, signaling that indicates a set of rules for transitions of states of metadata stored at the memory device. In some examples, the receiving component 525 may be configured as or otherwise support a means for receiving, after receiving the set of rules, a command from a host device associated with a set of data. In some examples, the receiving component 525 may be configured as or otherwise support a means for receiving a second command from the host device associated with the set of data after executing the command. In some examples, the receiving component 525 may be configured as or otherwise support a means for receiving, at the memory device, a second set of rules for the transitions of states of the metadata stored at the memory device. In some examples, the receiving component 525 may be configured as or otherwise support a means for receiving, at the memory device, a second command from the host device associated with the set of data. In some examples, the receiving component 525 may be configured as or otherwise support a means for transitioning the metadata associated with the set of data stored at the memory device from the second state to a third state based at least in part on the second command, the second state, and the second set of rules. In some examples, the receiving component 525 may be configured to receive the set of rules which includes receiving data or a bit string representative of a state table including a plurality of entries, each entry including an indicator of one of a plurality of commands, a current state, and a new state.

The metadata component 530 may be configured as or otherwise support a means for transitioning metadata associated with the set of data stored at the memory device from a first state to a second state based at least in part on the set of rules and the command. In some examples, the metadata component 530 may be configured as or otherwise support a means for maintaining the metadata associated with the set of data stored at the memory device at the second state based at least in part on the second command, the second state, and the set of rules.

In some examples, the metadata component 530 may be configured as or otherwise support a means for comparing the command and the first state of the metadata to the set of rules based at least in part on receiving the command, where transitioning the metadata is based at least in part on the comparison. In some examples, the metadata component 530 may be configured as or otherwise support a means for modifying a set of parity bits associated with the first state of the metadata to a second set of parity bits associated with the second state of the metadata based at least in part on transitioning the metadata and the set of rules.

The command component 535 may be configured as or otherwise support a means for executing the command received from the host device.

In some examples, the decoder component 540 may be configured as or otherwise support a means for decoding a codeword associated with the set of data to access the metadata associated with the codeword based at least in part on receiving the command, where transitioning the metadata associated with the set of data is based at least in part on the decoding.

In some examples, the transmitting component 545 may be configured as or otherwise support a means for transmitting, from the memory device to the host device, a response associated with the execution of the command and the first state of the metadata based at least in part on receiving the command and the set of rules. In some examples, the transmitting component 545 may be configured as or otherwise support a means for transmitting, from the memory device to the host device, a response associated with the execution of the command and the second state of the metadata based at least in part on receiving the command and the set of rules.

In some examples, the transmitting component 545 may be configured as or otherwise support a means for transmitting, from the memory device to the host device, the second set of parity bits based at least in part on executing the command.

In some examples, the encoder component 550 may be configured as or otherwise support a means for encoding the codeword associated with the set of data to write the metadata associated with the second state to the codeword based at least in part on decoding the codeword, accessing the metadata, and transitioning the metadata from the first state to the second state.

Figure 6:
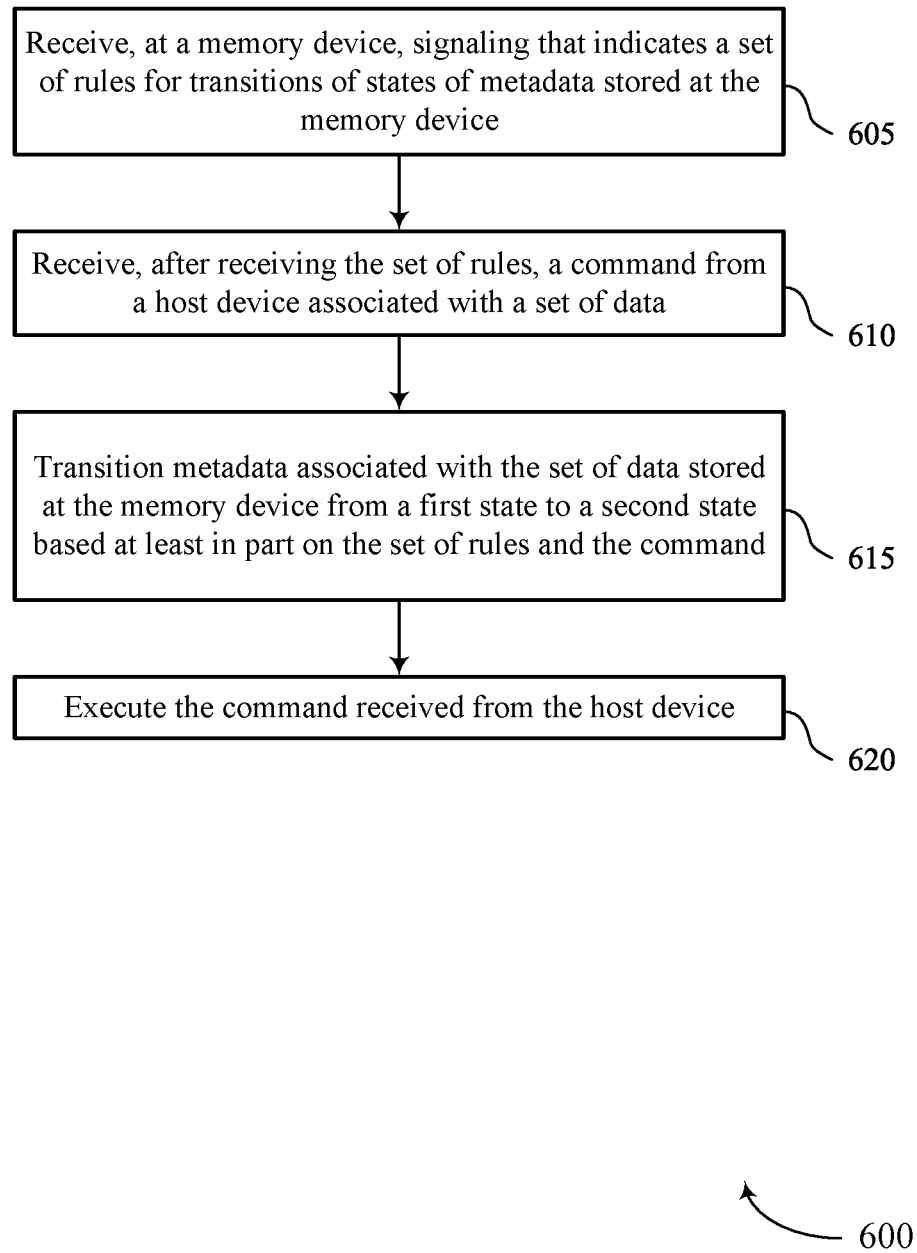
FIGS. 6 through 8 show flowcharts illustrating a method or methods that support programmable metadata in accordance with examples as disclosed herein.

FIG. 6 shows a flowchart illustrating a method 600 that supports programmable metadata in accordance with examples as disclosed herein. The operations of method 600 may be implemented by a memory device or its components as described herein. For example, the operations of method 600 may be performed by a memory device as described with reference to FIGS. 1 through 5. In some examples, a memory device may execute a set of instructions to control the functional elements of the device to perform the described functions. Additionally or alternatively, the memory device may perform aspects of the described functions using special-purpose hardware.

At 605, the method may include receiving, at a memory device, signaling that indicates a set of rules for transitions of states of metadata stored at the memory device. The operations of 605 may be performed in accordance with examples as disclosed herein. In some examples, aspects of the operations of 605 may be performed by a receiving component 525 as described with reference to FIG. 5.

At 610, the method may include receiving, after receiving the set of rules, a command from a host device associated with a set of data. The operations of 610 may be performed in accordance with examples as disclosed herein. In some examples, aspects of the operations of 610 may be performed by a receiving component 525 as described with reference to FIG. 5.

At 615, the method may include transitioning metadata associated with the set of data stored at the memory device from a first state to a second state based at least in part on the set of rules and the command. The operations of 615 may be performed in accordance with examples as disclosed herein. In some examples, aspects of the operations of 615 may be performed by a metadata component 530 as described with reference to FIG. 5.

At 620, the method may include executing the command received from the host device. The operations of 620 may be performed in accordance with examples as disclosed herein. In some examples, aspects of the operations of 620 may be performed by a command component 535 as described with reference to FIG. 5.

In some examples, an apparatus as described herein may perform a method or methods, such as the method 600. The apparatus may include, features, circuitry, logic, means, or instructions (e.g., a non-transitory computer-readable medium storing instructions executable by a processor) for receiving, at a memory device, signaling that indicates a set of rules for transitions of states of metadata stored at the memory device, receiving, after receiving the set of rules, a command from a host device associated with a set of data, transitioning metadata associated with the set of data stored at the memory device from a first state to a second state based at least in part on the set of rules and the command, and executing the command received from the host device.

Some cases of the method 600 and the apparatus described herein may further include operations, features, circuitry, logic, means, or instructions for receiving a second command from the host device associated with the set of data after executing the command and maintaining the metadata associated with the set of data stored at the memory device at the second state based at least in part on the second command, the second state, and the set of rules.

Some instances of the method 600 and the apparatus described herein may further include operations, features, circuitry, logic, means, or instructions for comparing the command and the first state of the metadata to the set of rules based at least in part on receiving the command, where transitioning the metadata may be based at least in part on the comparison.

Some examples of the method 600 and the apparatus described herein may further include operations, features, circuitry, logic, means, or instructions for decoding a codeword associated with the set of data to access the metadata associated with the codeword based at least in part on receiving the command, where transitioning the metadata associated with the set of data may be based at least in part on the decoding.

Some cases of the method 600 and the apparatus described herein may further include operations, features, circuitry, logic, means, or instructions for encoding the codeword associated with the set of data to write the metadata associated with the second state to the codeword based at least in part on decoding the codeword, accessing the metadata, and transitioning the metadata from the first state to the second state.

Some instances of the method 600 and the apparatus described herein may further include operations, features, circuitry, logic, means, or instructions for transmitting, from the memory device to the host device, a response associated with the execution of the command and the first state of the metadata based at least in part on receiving the command and the set of rules.

Some examples of the method 600 and the apparatus described herein may further include operations, features, circuitry, logic, means, or instructions for transmitting, from the memory device to the host device, a response associated with the execution of the command and the second state of the metadata based at least in part on receiving the command and the set of rules.

Some cases of the method 600 and the apparatus described herein may further include operations, features, circuitry, logic, means, or instructions for modifying a set of parity bits associated with the first state of the metadata to a second set of parity bits associated with the second state of the metadata based at least in part on transitioning the metadata and the set of rules.

Some instances of the method 600 and the apparatus described herein may further include operations, features, circuitry, logic, means, or instructions for transmitting, from the memory device to the host device, the second set of parity bits based at least in part on executing the command.

Some examples of the method 600 and the apparatus described herein may further include operations, features, circuitry, logic, means, or instructions for receiving, at the memory device, a second set of rules for the transitions of states of the metadata stored at the memory device, receiving, at the memory device, a second command from the host device associated with the set of data, and transitioning the metadata associated with the set of data stored at the memory device from the second state to a third state based at least in part on the second command, the second state, and the second set of rules.

Some cases of the method 600 and the apparatus described herein may further include operations, features, circuitry, logic, means, or instructions for receiving the set of rules includes receiving data or a bit string representative of a state table including a plurality of entries, each entry including an indicator of one of a plurality of commands, a current state, and a new state.

Figure 7:
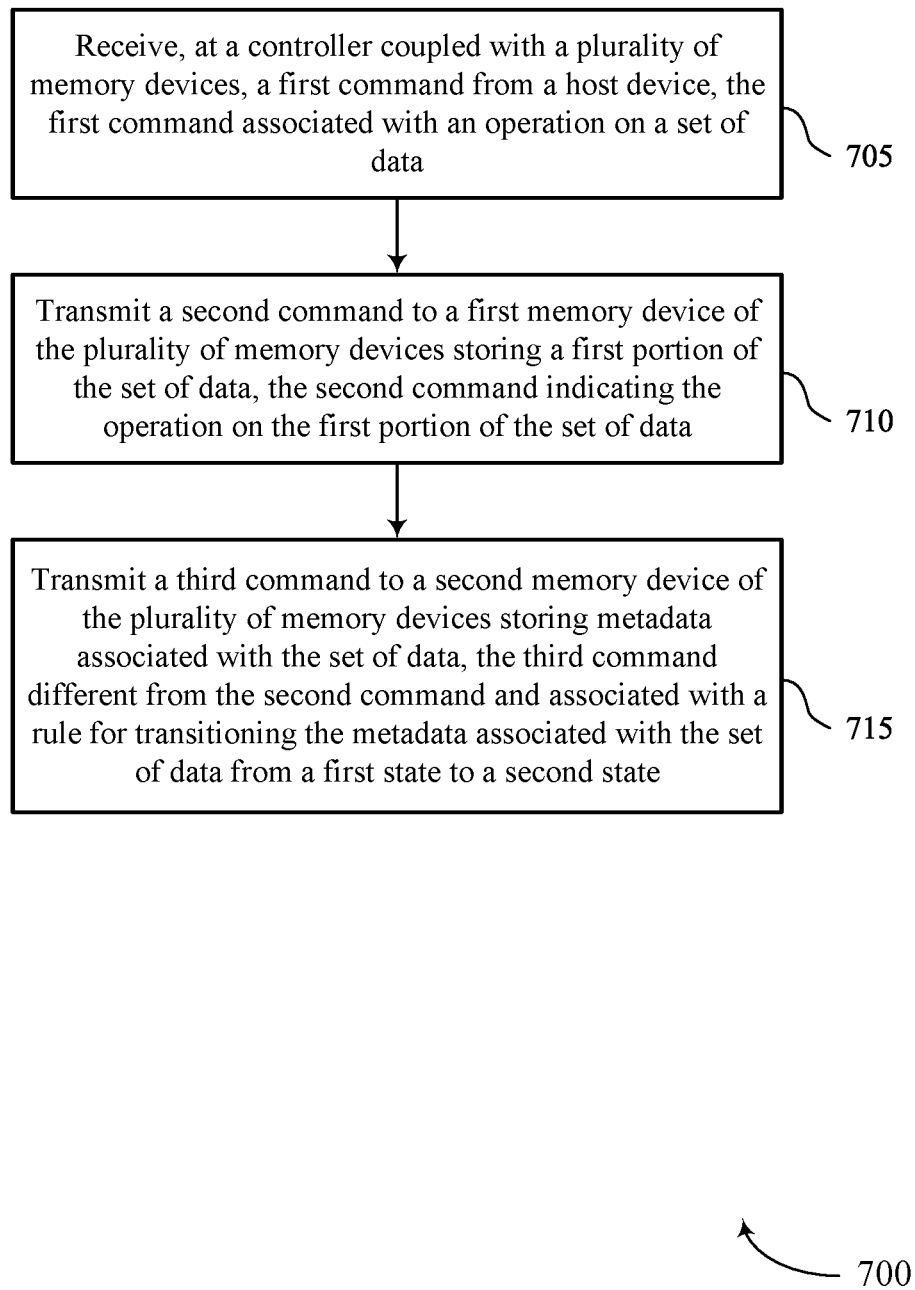

FIG. 7 shows a flowchart illustrating a method 700 that supports programmable metadata in accordance with examples as disclosed herein. The operations of method 700 may be implemented by a memory system or its components as described herein. For example, the operations of method 700 may be performed by a memory system as described with reference to FIGS. 1 through 5. In some examples, a memory system may execute a set of instructions to control the functional elements of the device to perform the described functions. Additionally or alternatively, the memory system may perform aspects of the described functions using special-purpose hardware.

At 705, the method may include receiving, at a controller coupled with a plurality of memory devices, a first command from a host device, the first command associated with an operation on a set of data. The operations of 705 may be performed in accordance with examples as disclosed herein. In some examples, aspects of the operations of 705 may be performed by a receiving component 525 as described with reference to FIG. 5.

At 710, the method may include transmitting a second command to a first memory device of the plurality of memory devices storing a first portion of the set of data, the second command indicating the operation on the first portion of the set of data. The operations of 710 may be performed in accordance with examples as disclosed herein. In some examples, aspects of the operations of 710 may be performed by a transmitting component 545 as described with reference to FIG. 5.

At 715, the method may include transmitting a third command to a second memory device of the plurality of memory devices storing metadata associated with the set of data, the third command different from the second command and associated with a rule for transitioning the metadata associated with the set of data from a first state to a second state. The operations of 715 may be performed in accordance with examples as disclosed herein. In some examples, aspects of the operations of 715 may be performed by the transmitting component 545 as described with reference to FIG. 5.

In some examples, an apparatus as described herein may perform a method or methods, such as the method 700. The apparatus may include, features, circuitry, logic, means, or instructions (e.g., a non-transitory computer-readable medium storing instructions executable by a processor) for receiving, at a controller coupled with a plurality of memory devices, a first command from a host device, the first command associated with an operation on a set of data, transmitting a second command to a first memory device of the plurality of memory devices storing a first portion of the set of data, the second command indicating the operation on the first portion of the set of data, and transmitting a third command to a second memory device of the plurality of memory devices storing metadata associated with the set of data, the third command different from the second command and associated with a rule for transitioning the metadata associated with the set of data from a first state to a second state.

Some instances of the method 700 and the apparatus described herein may further include operations, features, circuitry, logic, means, or instructions for receiving, at the controller, signaling that indicates a set of rules for transitions of a state of metadata data stored at the second memory device, where the third command may be transmitted based at least in part on the set of rules, and where the set of rules includes the rule.

In some cases of the method 700 and the apparatus described herein, transitioning, at the second memory device, the metadata associated with the set of data from the first state to the second state based at least in part on receiving the third command at the second memory device.

Some examples of the method 700 and the apparatus described herein may further include operations, features, circuitry, logic, means, or instructions for receiving, at the controller from the second memory device, a response associated with an execution of the third command based at least in part on transmitting the third command.

Some cases of the method 700 and the apparatus described herein may further include operations, features, circuitry, logic, means, or instructions for receiving, at the controller, a fourth command associated with a second operation on the set of data and transmitting a fifth command to the second memory device, the fifth command associated with maintaining the second state of the metadata based least in part on a set of rules for transitions of a state of metadata associated with the set of data, the fourth command, and the second state.

Some instances of the method 700 and the apparatus described herein may further include operations, features, circuitry, logic, means, or instructions for receiving, at the controller, a fourth command associated with a second operation on the set of data and transmitting a fifth command to the second memory device, the fifth command of associated with a rule for transitioning the metadata from the second state to a third state.

In some examples of the method 700 and the apparatus described herein, the first state of the metadata indicates a first state of cache coherency for the set of data stored at the first memory device, the second state of the metadata indicates a second state of cache coherency for the set of data stored at the first memory device, and the third state of the metadata indicates a third state of cache coherency for the set of data stored at the second memory device.

Figure 8:
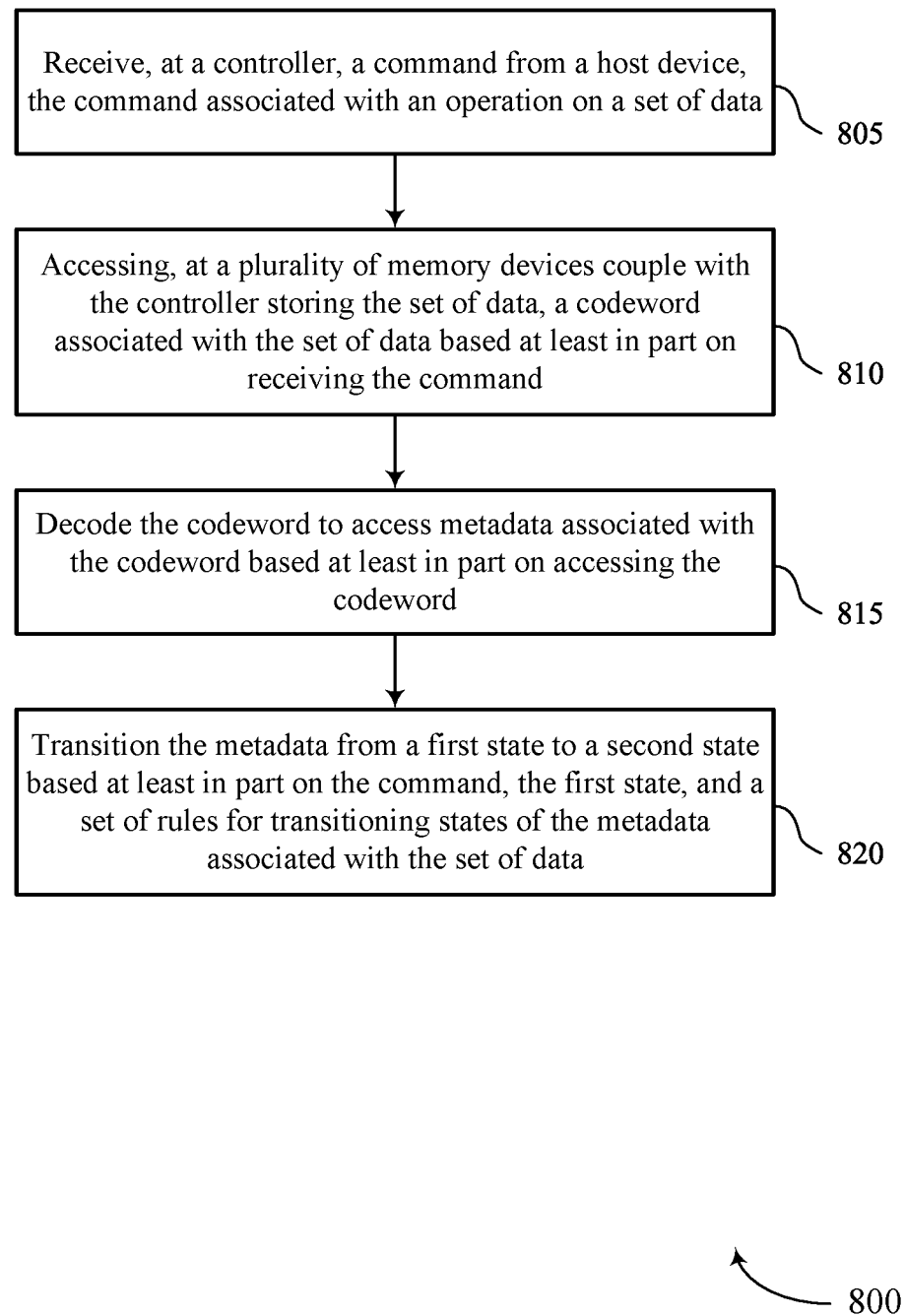

FIG. 8 shows a flowchart illustrating a method 800 that supports programmable metadata in accordance with examples as disclosed herein. The operations of method 800 may be implemented by a memory system or its components as described herein. For example, the operations of method 800 may be performed by a memory system as described with reference to FIGS. 1 through 5. In some examples, a memory system may execute a set of instructions to control the functional elements of the device to perform the described functions. Additionally or alternatively, the memory system may perform aspects of the described functions using special-purpose hardware.

At 805, the method may include receiving, at a controller, a command from a host device, the command associated with an operation on a set of data. The operations of 805 may be performed in accordance with examples as disclosed herein. In some examples, aspects of the operations of 805 may be performed by a receiving component 525 as described with reference to FIG. 5.

At 810, the method may include accessing, at a plurality of memory devices coupled with the controller storing the set of data, a codeword associated with the set of data based at least in part on receiving the command. The operations of 810 may be performed in accordance with examples as disclosed herein. In some examples, aspects of the operations of 810 may be performed by a command component 535 as described with reference to FIG. 5.

At 815, the method may include decoding the codeword to access metadata associated with the codeword based at least in part on accessing the codeword. The operations of 815 may be performed in accordance with examples as disclosed herein. In some examples, aspects of the operations of 815 may be performed by a decoder component 540 as described with reference to FIG. 5.

At 820, the method may include transitioning the metadata from a first state to a second state based at least in part on the command, the first state, and a set of rules for transitioning states of the metadata associated with the set of data. The operations of 820 may be performed in accordance with examples as disclosed herein. In some examples, aspects of the operations of 820 may be performed by metadata component 530 as described with reference to FIG. 5.

In some examples, an apparatus as described herein may perform a method or methods, such as the method 800. The apparatus may include, features, circuitry, logic, means, or instructions (e.g., a non-transitory computer-readable medium storing instructions executable by a processor) for receiving, at a controller, a command from a host device, the command associated with an operation on a set of data, accessing, at a plurality of memory devices coupled with the controller storing the set of data, a codeword associated with the set of data based at least in part on receiving the command, decoding the codeword to access metadata associated with the codeword based at least in part on accessing the codeword, and transitioning the metadata from a first state to a second state based at least in part on the command, the first state, and a set of rules for transitioning states of the metadata associated with the set of data.

Some instances of the method 800 and the apparatus described herein may further include operations, features, circuitry, logic, means, or instructions for writing a second codeword associated with an execution of the operation on the set of data, the second codeword including the second state of the metadata based at least in part on transitioning the metadata and writing the second codeword to the plurality of memory devices based at least in part on encoding the codeword with the metadata associated with the second state.

In some cases of the method 800 and the apparatus described herein, the second codeword includes a second set of data, the second set of data based at least in part on the execution of the operation on the set of data.

Some instances of the method 800 and the apparatus described herein may further include operations, features, circuitry, logic, means, or instructions for receiving, at the controller before receiving the command, signaling that indicating the set of rules for transitioning the states of the metadata stored at the plurality of memory devices.

It should be noted that the methods described herein describe possible implementations, and that the operations and the steps may be rearranged or otherwise modified and that other implementations are possible. Further, portions from two or more of the methods may be combined.

Another apparatus is described. The apparatus may include a memory array storing a set of data and a controller coupled with the memory array and configured to receive signaling that indicates a set of rules for transitions of states of metadata stored at the memory array, receive, after receiving the set of rules, a command from a host device associated with the set of data, transition metadata associated with the set of data stored at the memory array from a first state to a second state based at least in part on the command, the first state, and the set of rules, and execute the command received from the host device In some examples of the apparatus, the controller may be further configured to receive a second command from the host device associated with the set of data after executing the command and maintain the metadata associated with the set of data stored at the memory array at the second state based at least in part on the second command, the second state, and the set of rules.

In some instances of the apparatus, the controller may be further configured to compare the command and the first state of the metadata to the set of rules based at least in part on receiving the command, where the controller may be configured to transition the metadata based at least in part on the comparison.

In some cases of the apparatus, the controller may be further configured to decode a codeword associated with the set of data to access the metadata associated with the codeword based at least in part on receiving the command, where the controller may be configured to transition the metadata associated with the set of data based at least in part on the decoding.

In some examples of the apparatus, the controller may be further configured to transmit, to the host device, a response associated with the execution of the command and the first state of the metadata based at least in part on receiving the command and the set of rules.

In some instances of the apparatus, the controller may be further configured to transmit, to the host device, a response associated with the execution of the command and the second state of the metadata based at least in part on receiving the command and the set of rules.

In some cases of the apparatus, the controller may be further configured to modify a set of parity bits associated with the first state of the metadata to a second set of parity bits associated with the second state of the metadata based at least in part on transitioning the metadata and the set of rules.

In some examples of the apparatus, the controller may be further configured to transmit, to the host device, the second set of parity bits based at least in part on executing the command.

Another apparatus is described. The apparatus may include a plurality of memory devices including a first memory device storing a first portion of a set of data and a second memory device storing metadata associated with the set of data and a controller coupled with the plurality of memory devices, the controller configured to receive a first command from a host device, the first command associated with an operation on the set of data, transmit a second command to the first memory device, the second command indicating the operation on the first portion of the set of data, and transmit a third command to the second memory device, the third command different from the second command and associated with a rule for transitioning the metadata associated with the set of data from a first state to a second state In some instances of the apparatus, the controller may be further configured to receive signaling indicating a set of rules for transitions of states of metadata data stored at the second memory device, where the third command may be transmitted based at least in part on the set of rules, and where the set of rules includes the rule.

In some examples of the apparatus, the controller may be configured to receive, from the second memory device, a response associated with an execution of the third command based at least in part on transmitting the third command.

In some cases of the apparatus, the controller may be further configured to receive a fourth command associated with a second operation on the set of data and transmit a fifth command to the second memory device, the fifth command associated with maintaining the second state of the metadata based least in part on a set of rules for transitions of states of metadata associated with the set of data, the fourth command, and the second state.

In some examples of the apparatus, the controller may be further configured to receive a fourth command associated with a second operation on the set of data and transmit a fifth command to the second memory device, the fifth command of associated with a rule for transitioning the metadata from the second state to a third state based at least in part on a set of rules for transitions of states of metadata associated with the set of data, the fifth command, and the second state.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   receiving, at a memory device, signaling that indicates a set of rules for transitions of states of metadata stored at the memory device;
   receiving, after receiving the set of rules, a command from a host device associated with a set of data;
   comparing the command and a first state of the metadata to the set of rules based at least in part on receiving the command;
   transitioning metadata associated with the set of data stored at the memory device from the first state to a second state based at least in part on comparing the command and the first state of the metadata to the set of rules; and
   executing the command received from the host device.
2. The method of claim 1, further comprising:
   receiving a second command from the host device associated with the set of data after executing the command; and
   maintaining the metadata associated with the set of data stored at the memory device at the second state based at least in part on the second command, the second state, and the set of rules.
3. The method of claim 1, further comprising:
   decoding a codeword associated with the set of data to access the metadata associated with the codeword based at least in part on receiving the command, wherein transitioning the metadata associated with the set of data is based at least in part on the decoding.
4. The method of claim 3, further comprising:
   encoding the codeword associated with the set of data to write the metadata associated with the second state to the codeword based at least in part on decoding the codeword, accessing the metadata, and transitioning the metadata from the first state to the second state.
5. The method of claim 1, further comprising:
   transmitting, from the memory device to the host device, a response associated with the execution of the command and the first state of the metadata based at least in part on receiving the command and the set of rules.
6. The method of claim 1, further comprising:
   transmitting, from the memory device to the host device, a response associated with the execution of the command and the second state of the metadata based at least in part on receiving the command and the set of rules.
7. The method of claim 1, further comprising:
   receiving, at the memory device, a second set of rules for the transitions of states of the metadata stored at the memory device;
   receiving, at the memory device, a second command from the host device associated with the set of data;
   transitioning the metadata associated with the set of data stored at the memory device from the second state to a third state based at least in part on the second command, the second state, and the second set of rules.
8. The method of claim 1, wherein receiving the set of rules comprises receiving data or a bit string representative of a state table comprising a plurality of entries, each entry comprising an indicator of one of a plurality of commands, a current state, and a new state.
9. A method, comprising:
   receiving, at a memory device, signaling that indicates a set of rules for transitions of states of metadata stored at the memory device;
   receiving, after receiving the set of rules, a command from a host device associated with a set of data;
   transitioning metadata associated with the set of data stored at the memory device from a first state to a second state based at least in part on the set of rules and the command;
   modifying a set of parity bits associated with the first state of the metadata to a second set of parity bits associated with the second state of the metadata based at least in part on transitioning the metadata and the set of rules; and
   executing the command received from the host device.
10. The method of claim 9, further comprising:
    transmitting, from the memory device to the host device, the second set of parity bits based at least in part on executing the command.
11. A method, comprising:
    receiving, at a controller, a command from a host device, the command associated with an operation on a set of data;

accessing, at a plurality of memory devices coupled with the controller storing the set of data, a codeword associated with the set of data based at least in part on receiving the command;

decoding the codeword to access metadata associated with the codeword based at least in part on accessing the codeword;

comparing the command and a first state of metadata associated with the set of data stored at the plurality of memory devices to a set of rules for transitioning states of the metadata associated with the set of data based at least in part on receiving the command;

transitioning the metadata from the first state to a second state based at least in part on comparing the command and the first state of the metadata to the set of rules; and writing a second codeword that includes a second set of data that is based on an execution of the operation on the set of data, the second codeword including the second state of the metadata based at least in part on transitioning the metadata.

12. The method of claim 11, further comprising:
writing the second codeword to the plurality of memory devices based at least in part on encoding the codeword with the metadata associated with the second state.

13. The method of claim 11, further comprising:
receiving, at the controller before receiving the command, signaling that indicating the set of rules for transitioning the states of the metadata stored at the plurality of memory devices.

14. An apparatus, comprising:
a memory array storing a set of data; and
a controller coupled with the memory array and configured to:
  receive signaling that indicates a set of rules for transitions of states of metadata stored at the memory array;
  receive, after receiving the set of rules, a command from a host device associated with the set of data;
  compare the command and a first state of the metadata to the set of rules based at least in part on receiving the command;
  transition metadata associated with the set of data stored at the memory array from the first state to a second state based at least in part on the comparing the command and the first state of the metadata to the set of rules; and
  execute the command received from the host device.

15. The apparatus of claim 14, wherein the controller is further configured to:

receive a second command from the host device associated with the set of data after executing the command; and
  maintain the metadata associated with the set of data stored at the memory array at the second state based at least in part on the second command, the second state, and the set of rules.

16. The apparatus of claim 14, wherein the controller is further configured to:
  decode a codeword associated with the set of data to access the metadata associated with the codeword based at least in part on receiving the command, wherein the controller is configured to transition the metadata associated with the set of data based at least in part on the decoding.

17. The apparatus of claim 14, wherein the controller is further configured to:
  transmit, to the host device, a response associated with the execution of the command and the first state of the metadata based at least in part on receiving the command and the set of rules.

18. The apparatus of claim 14, wherein the controller is further configured to:
  transmit, to the host device, a response associated with the execution of the command and the second state of the metadata based at least in part on receiving the command and the set of rules.

19. An apparatus, comprising:
a memory array storing a set of data; and
a controller coupled with the memory array and configured to:
  receive signaling that indicates a set of rules for transitions of states of metadata stored at the memory array;
  receive, after receiving the set of rules, a command from a host device associated with the set of data;
  transition metadata associated with the set of data stored at the memory array from a first state to a second state based at least in part on the command, the first state, and the set of rules;
  modify a set of parity bit associated with the first state of the metadata to a second set of parity bits associated with the second state of the metadata based at least in part on transitioning the metadata and the set of rules; and
  execute the command received from the host device.

20. The apparatus of claim 19, wherein the controller is further configured to:
  transmit, to the host device, the second set of parity bits based at least in part on executing the command.

* * * * *